United States Patent

Crow

[15] 3,665,317

[45] May 23, 1972

[54] SEQUENTIAL AGC SYSTEM FOR SIGNAL RECEIVER

[72] Inventor: Robert Palmer Crow, Los Angeles, Calif.

[73] Assignee: RCA Corporation

[22] Filed: Apr. 7, 1970

[21] Appl. No.: 26,372

[52] U.S. Cl. ..............................325/319, 325/404, 325/405, 325/409, 325/410, 325/414, 330/25, 330/30 D, 330/38 M, 330/97, 330/100

[51] Int. Cl. ..........................................................H04b 1/28

[58] Field of Search ..................325/319, 397, 400, 404, 405, 325/411, 415, 409, 410, 414; 330/25, 26, 28, 69, 96, 97, 99, 100, 103, 30 D, 38 R, 38 M, 152, 90; 178/7.3 R, 7.3 DC

[56] References Cited

UNITED STATES PATENTS

| | | | |
|---|---|---|---|
| 3,284,713 | 11/1966 | Bailey | 330/69 |
| 2,159,803 | 5/1939 | Klotz | 325/404 |
| 3,127,565 | 3/1964 | Williams | 330/100 |

*Primary Examiner*—Robert L. Griffin
*Assistant Examiner*—Albert J. Mayer
*Attorney*—Edward J. Norton

[57] ABSTRACT

The use of one or more differential amplifiers in a cascaded carrier-frequency (IF and/or RF) amplifier for performing signal amplification in the forward direction of the cascaded amplifier, while simultaneously performing DC amplification of an AGC voltage derived from the output of the detector stage of the receiver in the backward direction of the cascaded amplifier.

9 Claims, 2 Drawing Figures

Figures 1, 2:
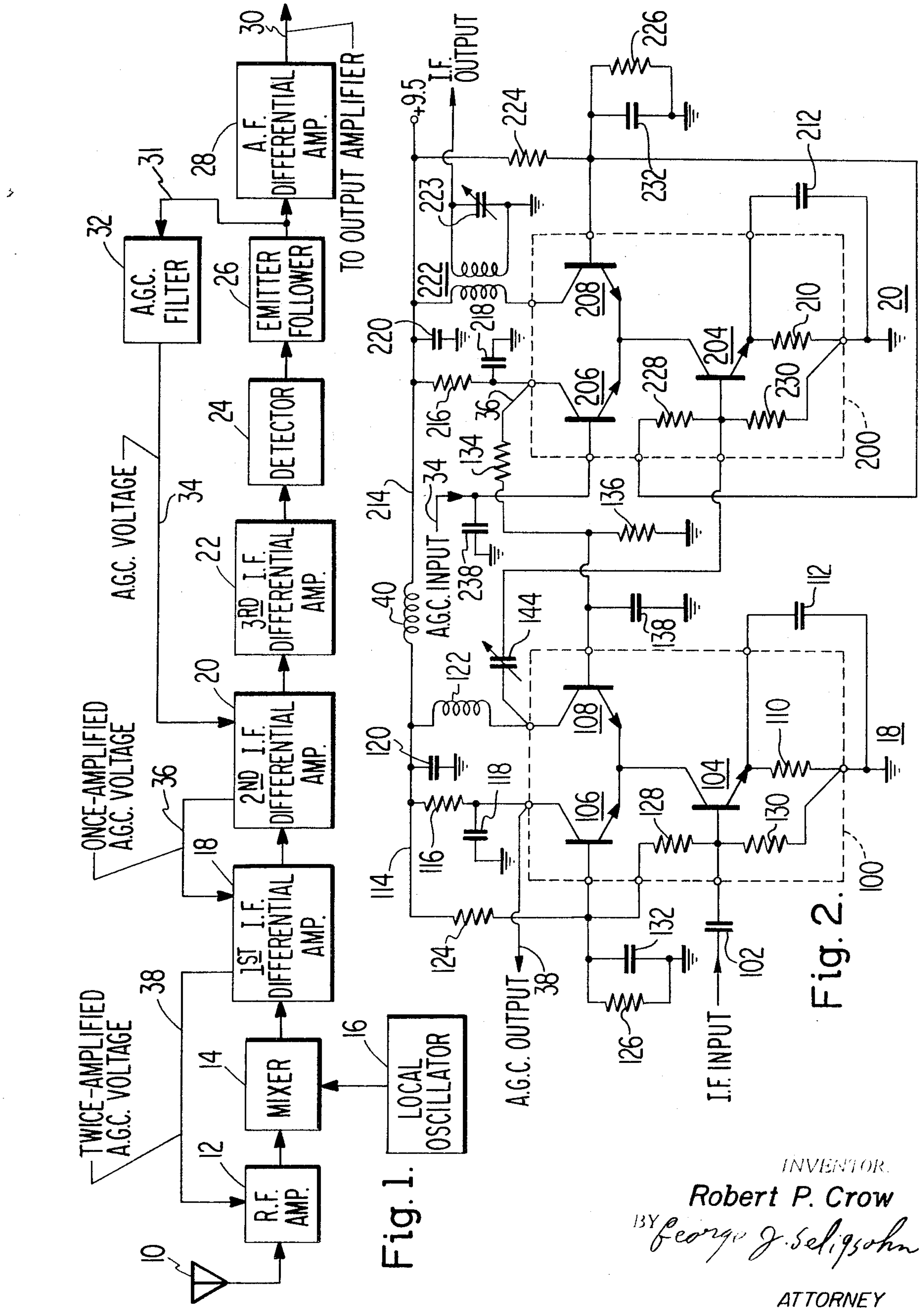

INVENTOR.
Robert P. Crow
BY George J. Seligsohn
ATTORNEY

SEQUENTIAL AGC SYSTEM FOR SIGNAL RECEIVER

This invention relates to signal receivers having automatic gain control and, more particularly, to a sequential automatic gain control system for signal receivers.

In high performance radio signal receivers, automatic gain control (AGC) operation is important to the overall performance. Several factors are involved. In superheterodyne receivers, it is desirable that gain reduction for low level signals be accomplished in one of the later IF amplifier stages in order to obtain the maximum signal-to-noise ratio for any given level of signal. As signal levels are increased, and adequate signal-to-noise ratios are obtained, it becomes desirable to shift gain control to one of the earlier IF amplifier stages, and even to the input RF amplifier of the receiver, in order to provide better protection against cross modulation and other nonlinear effects.

Thus, some form of sequential AGC system, whereby control of the earlier receiver stages is delayed, is highly desirable; several techniques for providing such systems in conjunction with cascaded single transistor stage amplifiers are presently known in the art.

Recently, it has become possible to make use of monolithic integrated circuits in various amplifier stages of a signal receiver. A common type of present day monolithic integrated circuit, which is particularly useful as part of an IF amplifier stage of a signal receiver, consists of a differential amplifier comprising a pair of transistors having their emitters coupled to each other, plus a constant current source comprising a transistor having its collector coupled to the emitters of the differential amplifier transistors.

As is known in the art, the signal input in such an IF differential amplifier stage can be applied to the input of a constant current control device, such as the transistor, constant current source referred to above and the signal output of the IF differential amplifier can be obtained from the output terminal of one of the pair of intercoupled differential amplifier control devices, which may be the collector of one of the transistors of the differential pair.

As is further known in the art, an automatic gain control voltage may be employed to control the relative biases applied to the two respective differential amplifier transistors, thereby controlling the relative portion of the total current through the constant current transistor carried by each of the two respective differential amplifier transistors. In particular, maximum gain of the IF amplifier occurs in the case where the relative bias voltages applied to the respective differential amplifier transistors is such that a major portion, if not all of the total current flowing through the constant current transistor will be carried by that one of the differential amplifier transistors from which the signal output is derived. As the AGC voltage reaches a value sufficient to permit the transistor which is essentially cut off to conduct, the portion of the total current which is carried by the differential amplifier transistor from which the output signal is derived decreases, and, hence, its gain decreases in accordance with the amount of decrease in the current therethrough. It is also known that by making the initial relative biases more than sufficient to cut off that one of the differential amplifier transistors from which the output signal is not derived, and then applying an AGC voltage tending to turn on this cutoff transistor, a delayed AGC action may be obtained.

In the past, an AGC control voltage was either employed to control only a single IF differential amplifier or, if employed to control a plurality of cascaded IF differential amplifier stages, was applied in parallel to the several stages. Furthermore, normally a separate DC amplifier was required for deriving an AGC control voltage of sufficient power and voltage swing to adequately control the one or more differential amplifiers. In other words, in the past signal receivers employing a plurality of cascaded carrier-frequency amplifier stages (RF and/or IF) including one or more differential amplifiers, were not capable of providing a sequential AGC system, with the attendant advantages thereof, discussed above.

It is therefore an object of the present invention to provide an improved AGC system for use with a differential amplifier.

These and other objects, features and advantages of the present invention will become more apparent from the following detailed description taken together with the accompanying drawing in which:

FIG. 1 is a block diagram of a signal receiver employing the present invention, and FIG. 2 is a schematic circuit diagram of a preferred embodiment of the first and second IF differential amplifiers of FIG. 1.

It has been found that differential amplifiers, of the type discussed above which employ monolithic integrated circuits, may be modified to provide desirable sequential AGC operation. In particular by coupling a signal-bypassed resistance load to the output of the differential amplifier control device from which the output signal of the differential amplifier is not derived, this differential amplifier control device is made to perform two separate and distinct functions. First, as in the past, it still acts to control the current through and, hence, the gain of the other control device of that differential amplifier, from which the output signal is derived, in accordance with the applied AGC voltage input to the differential amplifier. Second, it performs the new function of simultaneously operating as a DC amplifier for the AGC voltage input to thereby provide an amplified AGC voltage output which may be applied as an AGC control voltage input to a preceding one of the plurality of cascaded amplifier stages. This permits the same cascaded amplifier to simultaneously provide signal amplification in a forward direction and stablized AGC voltage amplification in a backward direction, which results in high IF power gain, high AGC gain sequentially controlled in an improved manner, and an economic design requiring no separate AGC amplifier. All these benefits are achieved at the cost of only the addition of a signal-bypassed resistance load in each cascaded differential amplifier employed for amplifying the AGC voltage input applied thereto.

Referring now to FIG. 1, a radio signal picked up by antenna 10 is amplified by RF amplifier 12 and applied as a first input to mixer 14. Mixer 14 has the output of local oscillator 16 applied as a second input thereto, which results in mixer 14 producing an IF signal output. The IF signal output of mixer 14 is amplified, in turn, by each of cascaded first IF differential amplifier 18, second IF differential amplifier 20 and third IF differential amplifier 22.

The IF signal output on third IF differential amplifier 22 is detected by detector 24, which produces both a detected-carrier DC component and a demodulated audiofrequency signal component. Both of these components are passed through emitter follower 26 and applied as an input to AGC filter 32. THe demodulated audiofrequency component is passed by AC coupling means to an input of audio differential amplifier 28. Audio differential amplifier 28 serves to amplify audiofrequency signals and its output appearing on conductor 30 is forwarded to an output amplifier, not shown.

The entire amplifier signal appearing on conductor 31 is applied as an input to AGC filter 32, which passes only the detected-carrier DC component and applies this to conductor 34 as an AGC voltage. The AGC voltage on conductor 34 is applied to second IF differential amplifier 20 to effect the control of the gain of amplifier 20 in a manner to be discussed below in connection with FIG. 2. (Although preferably the AGC voltage is obtained from the amplified signal appearing on conductor 31, it could be obtained directly from the output of detector 24.)

Further, amplifier 20 serves to provide a DC amplification of the AGC voltage, in a manner to be discussed in detail below in connection with FIG. 2, and to apply a "once-amplified" AGC voltage to conductor 36. The "once-amplified" AGC voltage on conductor 36 is applied to preceding first IF differential amplifier 18 to effect the control of the gain thereof in a manner more fully described below in connection with FIG. 2. In addition, first IF differential amplifier 18 serves to act as a DC amplifier for further amplifying the AGC voltage applied to amplifier 18 and to apply a "twice-amplified" AGC voltage to conductor 38. The "twice-amplified" AGC voltage on conductor 38 is applied to RF amplifier 12 and serves to control the gain thereof.

Referring now to FIG. 2, there is shown a schematic circuit diagram of first and second IF differential amplifiers 18 and 20, respectively, along with the inputs and outputs thereto. Each of amplifiers 18 and 20 includes an integrated monolithic circuit in association with discrete circuit elements. In particular, the circuit elements of amplifier 18 includes as part of the monolithic integrated circuit thereof are shown within dashed box 100 and the circuit elements of amplifier 20 included as part of the monolithic integrated circuit thereof are shown within the dashed box 200. The discrete elements of amplifiers 18 and 20 are shown outside of dashed boxes 100 and 200, respectively.

As shown, an IF input from mixer 14 is coupled through capacitances 102 to the base of constant-current transistor 104 of amplifier 18. The emitters of both left-hand differential transistor 106 and right-hand differential transistor 108 of amplifier 18 are connected directly to each other and to the collector of transistor 104. The emitter of transistor 104 is coupled to a point of reference potential through resistance 110. Resistance 110 is bypassed by capacitance 112. The collector of transistor 106 is connected to a point of fixed positive potential 114 through resistance load 116. Resistance load 116 is signal-bypassed by capacitance 118, which is coupled between the collector of transistor 106 and the point of reference potential. The point of fixed positive potential 114 is coupled to point of + 9.5 volt power-supply potential 214 through RF choke 40. Further, point of fixed positive potential 114 is bypassed to the point of reference potential by capacitance 120 and point of power supply potential 214 is bypassed to the point of reference potential by capacitance 220. Elements 40, 120 and 220 form a power supply decoupling network between amplifier 18 and amplifier 20.

Inductance 122 coupled between the collector of transistor 108 and point of positive potential 114 along with variable capacitor 144 serves as an "L" type impedance matching network between amplifier 18 and amplifier 20.

The base of transistor 106 has a fixed bias applied thereto determined by the positive potential on conductor 114, the value of resistance 124 connected between conductor 114 and the base of transistor 106, the value of resistance 126 connected between the base of transistor 106 and the point of reference potential, the value of resistance 128 connected between the base of transistor 106 and the base of transistor 104, and the value of resistance 130 connected between the base of transistor 104 and the point of reference potential. The base of transistor 106 is signal-bypassed by capacitance 132.

The value of the respective resistances 124, 126, 128, and 130 and the potential on conductor 114 also determine the bias on the base of transistor 104.

A variable bias determined by the once-amplified AGC voltage on conductor 36 is applied to the base of the transistor 108 by means of resistance 134 connected between conductor 36 and the base of transistor 108 and by resistance 136 connected between the base of transistor 108 and the point of reference potential. The base of transistor 108 is signal-bypassed by capacitance 138.

The signal output appearing on the collector of transistor 108 is coupled to the base of constant transistor 204 of amplifier 20 by variable capacitance 144.

The emitters of left-hand differential transistor 206 and right-hand differential transistor 208 of amplifier 20 are directly connected to each other and to the collector of constant-current transistor 204. Reistance 210 is coupled between the emitter of transistor 204 and the point of reference potential. Resistance 210 is bypassed by capacitance 212.

The collector of transistor 206 is coupled to the point of positive potential on conductor 214 through resistance load 216. Resistance load 216 is signal-bypassed by capacitance 218 coupled between the collector of transistor 206 and the point of reference potential.

The primary winding of transformer 222 coupled between the collector of transistor 208 and the point of positive potential on conductor 214, together with variable capacitance 223 coupled in parallel with the secondary winding of transformer 222, from the signal load for amplifier 20.

A fixed bias is applied to the base of transistor 208 which is determined by the + 9.5 positive voltage on conductor 214, the value of resistance 224 connected between the point of positive potential on conductor 214 and the base of transistor 208, the value of resistance 226 connected between the base of transistor 208 and the point of reference potential, the value of resistance 228 connected between the base of transistor 208 and the base of transistor 204, and the value of resistance 230 connected between the base of transistor 204 and the point of reference potential. The base of transistor 208 is signal-bypassed by capacitance 232 connected between the base of transistor 208 and the point of reference potential. The + 9.5 volt value of the point of positive potential on conductor 214 along with the respective values of resistances 224, 226, 228, and 230 also determine the bias applied to the base of transistor 204.

A variable bias is applied to the base of transistor 206 from AGC input 34, which is obtained from the output of filter 32 of FIG. 1. The variable bias applied to the base of transistor 206 is signal-bypassed by capacitance 238.

Representative values of the more pertinent circuit elements in FIG. 2, for an IF of 16 megahertz, are listed below for illustrative purposes:

| | | |
|---|---|---|
| 102 | 100 | picofarad |
| 110 | 500 | ohm |
| 112 | .01 | microfarad |
| 116 | 3000 | ohm |
| 118 | .01 | microfarad |
| 122 | 10 | microhenries |
| 124 | 3300 | ohm |
| 126 | 5600 | ohm |
| 128 | 5000 | ohm |
| 130 | 2800 | ohm |
| 132 | .01 | microfarad |
| 134 | 22000 | ohm |
| 136 | 43000 | ohm |
| 138 | .01 | microfarad |
| 144 | 4.5–15 | picofarad |
| 210 | 500 | ohm |
| 212 | .01 | microfarad |
| 216 | 2000 | ohm |
| 218 | .01 | microfarad |
| 223 | 62 | picofarad |
| 224 | 3300 | ohm |
| 226 | 5600 | ohm |
| 228 | 5000 | ohm |
| 230 | 2800 | ohm |
| 232 | 0.01 | microfarad |
| 238 | 0.01 | microfarad |

Referring now to the operation of the receiver shown in FIGS. 1 and 2, first, assume that no radio signal is being received by antenna 10. Under this condition, the relative biases applied to the respective bases of transistors 106 and 108 will be in this application such as to be more than sufficient to cutoff transistor 106 and permit the entire quiescent current through constant-current transistor 104 to flow through only transistor 108. In a similar manner, the relative biases apply to respective bases of transistors 206 and 208 will be more than sufficient to cutoff transistor 206 and permit the total quiescent current through constant-current transistor 204 to flow through only transistor 208. Of course, since under this condition there is no input signal, there will be no output signal for detector 24 to detect or for audiofrequency differential amplifier 28 to amplify.

Second, assume that a very low amplitude radio signal is picked up by antenna 10. Under this condition, a small signal will be detected by detector 24, amplified by amplifier 26, and filtered by filter 32 to provide a positive-going AGC voltage on conductor 34 which is a direct function of the amplitude of the detected-carrier DC component. This causes the AGC voltage on conductor 34 to become slightly more positive, but not sufficiently more positive to turn on cutoff transistor 206. Therefore, signal-amplifying transistor 208 of amplifier 20 continues to operate at maximum gain, and no change in the potential on conductor 36 takes place. Therefore, amplifier 18, as well as amplifier 20, continues to operate at its maximum possible gain in response to the receipt of very low amplitude radio signals by antenna 10.

Third, assume that a somewhat higher amplitude radio signal is received by antenna 10, so that the magnitude of the AGC voltage on conductor 34 is moved in a positive direction by a sufficient amount to permit transistor 206 to begin conducting. Any conduction by transistor 206 will lower the current conducted by transistor 208, since the average sum of the two currents must be substantially constant as determined by constant-current transistor 204. The lowering of the current through transistor 208 lowers the gain of this stage and, thus, provides a certain amount of gain reduction, or automatic gain control. Simultaneously, conduction by transistor 206 changes the potential at the collector of transistor 206 in a negative direction due to the voltage drop across signal-bypassed resistance load 216. Resistances 134 and signal-bypasses resistance 136 form a voltage divider for applying a portion of the voltage at the collector of transistor 206 to the base of transistor 108. Thus, in response to the conduction of transistor 206, the bias applied to transistor 108 will become less positive. However, as long as the relative biases of transistors 106 and 108 remain sufficient to maintain transistor 106 cutoff, all the current through constant-current transistor 104 will still flow through transistor 108 and transistor 108 will still provide maximum gain, even though the base of transistor 108 is at a somewhat less positive potential.

However, assume now that the amplitude of a received radio signal by antenna 10 becomes sufficiently large so that a relatively high positive bias is applied to the base of transistor 206, causing transistor 206 to conduct heavily and transistor 208 to conduct lightly. Under this condition, the voltage on conductor 36, connected to the collector of transistor 206, will drop sufficiently to make the relative biases applied to the respective bases of transistors 106 and 108 such that transistor 106 conducts. This results in a reduction of the gain of transistor 108, as well as a larger reduction in the gain of 208 and, further, results in the potential on AGC output 38 becoming less positive, due to the voltage drop in signal-bypassed resistance load 116 when transistor 106 conducts. As shown in FIG. 1, the voltage on conductor 38 is applied as the AGC voltage to RF amplifier 12, the first or input amplifier of the cascade. From the foregoing discussion, it is clear that the present invention provides delayed sequential AGC for the signal receiver.

Thus, AGC action starts in the second IF amplifier stage and continues throughout the input signal range at a very modest rate. Starting somewhat above threshold signal levels, AGC action begins in the first IF amplifier stage, again continuing throughout the input signal range at a moderate rate. AGC action then starts in the RF amplifier at a level where the signal-to-noise ratio exceeds 20 db. From this point, because of the AGC voltage amplification of the IF stages, AGC action is primarily in the RF amplifier stage. In fact, so much so that substantially complete current cutoff of this stage is effected with inputs of approximately 10 millivolts. Above this level, the IF stages take over control as may be necessary. Resulting performance is excellent, the total control range exceeding 120 db, with relatively little circuitry required.

What is claimed is:

1. In a signal receiver comprising a detector stage preceded by a plurality of cascaded amplifier stages for successively amplifying an applied input radiofrequency signal prior to detection thereof by said detector stage, at least one of said amplifier stages other than a first of said stages being a differential amplifier stage that includes first and second intercoupled control devices, and means responsive to a signal input applied to said differential amplifier stage for obtaining an amplified signal output from only a given one of the first and second control devices, said input radiofrequency signal being adapted to be applied as an input to said first of said amplifier stages with the amplified signal output of each of said stages being applied as an input to a succeeding stage, the improvement therewith of an automatic gain control circuit comprising a signal-bypassed resistance load coupled as an output of the other than said given one of said first and second control devices of said differential amplifier stage, means for applying a control voltage derived from the output of said detector stage as an automatic gain control input to said differential amplifier stage, and means for applying the amplified output derived across said signal-bypassed resistance load of said differential amplifier stage as an automatic gain control input to a preceding amplifier stage.

2. The receiver defined in claim 1, wherein said means for applying a control voltage includes an audiofrequency emitter follower amplifier stage for amplifying both the detected D.C. carrier component and the audio signal component of the output of said detector stage and an automatic gain control filter coupled to the output of said audiofrequency differential amplifier stage.

3. The receiver defined in claim 1, wherein said first and second control devices, respectively, comprise first and second transistors each having a base, an emitter and a collector, and wherein said differential amplifier further comprises a signal-controlled constant current device coupling the emitters of both said first and second transistors to a point of reference potential, means for applying a given fixed bias with respect to said point of reference potential to the base of said first transistor, means for applying a variable bias including said control voltage with respect to said point of reference potential to the base of said second transistor, means for controlling said constant-current device in accordance with said signal input to said differential amplifier stage, signal-output means coupling the collector of one of said first and second transistors to a point of fixed potential with respect to said point of reference potential for obtaining said amplified signal output, and means coupling the collector of the other of said first and second transistors to said point of fixed potential through said signal-bypassed resistance load.

4. The receiver defined in claim 3, wherein said signal-controlled constant current device includes a third transistor having a base, emitter and collector with the collector of said third transistor being connected to the respective emitters of said first and second transistors, means for coupling the emitter of said third transistor to said point of reference potential, and means for applying said signal input between the base of said third transistor and said point of reference potential.

5. The receiver defined in claim 1, wherein, said plurality of cascaded amplifier stages includes both radiofrequency and intermediate-frequency amplifier stages, and wherein said differential amplifier stage is an intermediate-frequency stage and said first stage is a radiofrequency stage.

6. In a signal receiver comprising a detector stage preceded by a plurality of cascaded amplifier stages for successively amplifying an applied input radio signal prior to detection thereof by said detector stage, at least two of said stages other than a first of said stages being differential amplifier stages, whereby one of said differential amplifier stages precedes another of said differential amplifier stages, each of said differential amplifier stages including respective first and second intercoupled control devices, and means responsive to a signal input applied to a differential amplifier stage for obtaining an amplifier signal output from only a given one of said first and second control devices, thereof, said input radio signal being adapted to be applied as an input to said first of said amplifier stages with the amplified signal output of each of said stages being applied as an input to a succeeding stage, the improvement therewith of an automatic gain control circuit comprising a signal-bypassed resistance load coupled as an output of the other than said given one of said first and second control devices of each of said respective differential amplifier stages, means for applying a control voltage derived from the output of said detector stage as an automatic gain control input to said other than said given one of said first and second control devices of the last differential amplifier stages, means for applying the amplified output derived across said signal-bypassed resistance load of said first and second control devices of said last other than said given one of said differential amplifier stages as an automatic gain control input to said preceding one of said differential amplifier stages, and means for applying the amplified output derived across said signal-bypassed resistance load of said first differential amplifier stages as an automatic gain control input to an amplifier stage preceding both of said differential amplifier stages.

7. The receiver defined in claim 6, wherein said first and second control devices, respectively, of each of said differential amplifiers comprise first and second transistors each having a base, an emitter and a collector, and wherein each of said differential amplifiers further comprises a signal-controlled constant current device coupling the emitters of both said first and second transistors of that differential amplifier to a point of reference potential, means for applying a given fixed bias with respect to said point of reference potential to the base of said first transistor of said other differential amplifier and to said second transistor of said one differential amplifier, means for applying a variable bias including said control voltage with respect to said point of reference potential to the base of said second transistor of said other differential amplifier, means for controlling said constant-current device of said one differential amplifier with the signal input thereto, first signal-output means coupling the collector of said first transistor of said one differential amplifier to a point of fixed potential with respect to said point of reference potential for obtaining the amplified signal output therefrom, means for controlling said constant current device of said other differential amplifier with the signal output from said one differential amplifier, second signal-output means coupling the collector of said first transistor of said other differential amplifier to said point fixed potential for obtaining the amplified signal output therefrom, means coupling the collector of said second transistor of said other differential amplifier to said point of fixed potential through said signal-bypassed resistance load of said other differential amplifier, means for applying a variable bias including the voltage across the signal-bypassed resistance load of said other differential amplifier to the base of said first transistor of said one differential amplifier, and means coupling the collector of said second transistor of said one differential amplifier to said point of fixed potential through said signal-bypassed resistance load of said one differential amplifier.

8. The receiver defined in claim 6 wherein said plurality of cascaded amplifier stages includes both radiofrequency and intermediate-frequency amplifier stages, and wherein said differential amplifier stages are intermediate-frequency amplifier stages and said amplifier stage preceding both of said differential amplifier stages is a radiofrequency amplifier stage.

9. In a signal receiver comprising a detector stage preceded by a plurality of cascaded amplifier stages for successively amplifying an applied input radio frequency signal prior to detection thereof by said detector stage, at least one of said amplifier stages other than a first of said stages being a differential amplifier stage that includes first and second intercoupled control devices, and means responsive to a signal input applied to said differential amplifier stage for obtaining an amplified signal output from only a given one of the first and second control devices, said input radiofrequency signal being adapted to be applied as an input to said first of said amplifier stages with the amplified signal output of each of said stages being applied as an input to a succeeding stage, the improvement therewith of an automatic gain control circuit comprising:

means for applying a control voltage derived from the output of said detector stage as an automatic gain control input to said differential amplifier stage, means for voltage amplifying said control voltage in said differential amplifier and developing a DC amplified voltage as an output from the other than said given one of said first and second control devices of said differential amplifier stage, and means for coupling said amplified DC voltage as an automatic gain control input to a preceding amplifier stage.

* * * * *

UNITED STATES PATENT OFFICE
CERTIFICATE OF CORRECTION

Patent No. 3,665,317 Dated May 23, 1972

Inventor(s) Robert Palmer Crow

It is certified that error appears in the above-identified patent and that said Letters Patent are hereby corrected as shown below:

Column 2, line 53 "THe" should be --The--; Column 3, lines 11 and 12 "includes" should be --included--; Column 3, line 67 "constant" should be --constant-current--.

Signed and sealed this 5th day of September 1972.

(SEAL)
Attest:

EDWARD M.FLETCHER,JR.
Attesting Officer

ROBERT GOTTSCHALK
Commissioner of Patents